United States Patent
Khan et al.

(10) Patent No.: US 9,594,100 B2
(45) Date of Patent: Mar. 14, 2017

(54) APPARATUS AND METHOD FOR EVALUATING THE PERFORMANCE OF A SYSTEM IN A CONTROL LOOP

(71) Applicant: ANALOG DEVICES GLOBAL, Hamilton (BM)

(72) Inventors: Muhammad Kalimuddin Khan, Rochestown (IE); Kenneth J. Mulvaney, Coolaney (IE); Michael Deeney, Carrigaline (IE); Niall Kevin Kearney, Killeagh (IE)

(73) Assignee: Analog Devices Global, Hamilton (BM)

( * ) Notice: Subject to any disclaimer, the term of this patent is extended or adjusted under 35 U.S.C. 154(b) by 615 days.

(21) Appl. No.: 14/020,404

(22) Filed: Sep. 6, 2013

(65) Prior Publication Data
US 2015/0073739 A1 Mar. 12, 2015

(51) Int. Cl.
*G01R 23/02* (2006.01)
*H03L 7/197* (2006.01)
(Continued)

(52) U.S. Cl.
CPC ............. *G01R 23/02* (2013.01); *H03L 7/095* (2013.01); *H03L 7/193* (2013.01); *H03L 7/1974* (2013.01); *H03L 7/1976* (2013.01)

(58) Field of Classification Search
CPC ...... G01R 23/02; G01R 23/00; G01R 23/005; H03L 7/06; H03L 7/08; H03L 7/087; H03L 7/095; H03L 7/0992; H03L 7/18; H03L 7/181; H03L 7/183; H03L 7/193; H03L 7/197; H03L 7/1974; H03L 7/199
See application file for complete search history.

(56) References Cited

U.S. PATENT DOCUMENTS 8,073,042 B1 * 12/2011 Grivna .................... H04L 7/033
375/224
8,456,206 B2 6/2013 Namdar-Mehdiabadi et al.
(Continued)

FOREIGN PATENT DOCUMENTS

| CN | 1917372 | 2/2007 |
|---|---|---|
| CN | 1940584 | 4/2007 |
| EP | 0641082 | 3/1995 |

OTHER PUBLICATIONS

Suchitav Khadanga, Synchronous Programmable Divider Design for PLL Using 0.18 um CMOS Technology, 2003, Proceedings of the 3rd IEEE International Workshop on System-on-Chip for Real-Time Applications, 6 pp.*

(Continued)

*Primary Examiner* — Toan Le
(74) *Attorney, Agent, or Firm* — Knobbe, Martens, Olson & Bear, LLP

(57) ABSTRACT

A monitoring circuit for monitoring the performance of a phase locked loop having a divider therein, the divider comprising at least a first counter, the monitoring circuit comprising at least one memory element for capturing a value of the first counter after a predetermined time from a system event in the operation of the phase locked loop, a variability calculator for comparing a value of the counter with a preceding value of the counter to calculate a variation, and a circuit responsive to the estimate of variation for outputting a status signal.

20 Claims, 7 Drawing Sheets

(51) Int. Cl.
H03L 7/095 (2006.01)
H03L 7/193 (2006.01)

(56) References Cited

U.S. PATENT DOCUMENTS

| | | |
|---|---|---|
| 8,526,558 B1 | 9/2013 | Grivna |
| 2012/0098570 A1 | 4/2012 | Wang et al. |

OTHER PUBLICATIONS

Office Action of May 18, 2015 for German Patent Application No. 102014112124.4, 8 pages, 5 page translation.
Forbes, Peadar and Collins, Ian, AN-873 Application Note: Lock Detect on the ADF4xxx Family of PLL Synthesizers, 2006, 8 Pages. Available at: http://www.analog.com/static/imported-files/application_notes/AN-873.pdf (accessed Dec. 5, 2013).
Chinese Office Action of Dec. 26, 2016 for Chinese Patent Application No. 201410453627.2.

* cited by examiner

APPARATUS AND METHOD FOR EVALUATING THE PERFORMANCE OF A SYSTEM IN A CONTROL LOOP

FIELD

A method and apparatus is disclosed for monitoring the performance of a system, such as a frequency generator within a phase locked loop.

BACKGROUND

It is known that a high frequency signal can be formed as a frequency multiplied version of a reference clock by way of a voltage controlled oscillator (VCO) working as part of a phase locked loop (PLL). It is desirable to know if the phase locked loop has obtained locked status, and/or whether the operating conditions for components within the loop are such that the control function of the phase locked loop can maintain locked status.

SUMMARY

This disclosure relates to a method of and apparatus for monitoring the status of a counter, and by observing changes in the counter value to determine whether a control loop is performing adequately.

Disclosed herein is a monitoring circuit for monitoring the performance of a phase locked loop having a divider therein, the divider comprising a first counter, the monitoring circuit comprising at least one memory element for capturing a value of the first counter after a predetermined time from a system event in the operation of the phase locked loop, a variability calculator for comparing a value of the counter with a preceding value of the counter to calculate a variation, and a circuit responsive to the estimate of variation for outputting a status signal.

The counter may be observed on a periodic basis, or at fixed time intervals after a system event, such as a predetermined feature of a system clock (e.g. a rising edge or a falling edge thereof) or a predetermined time after setting or resetting the counter to an initial value for use in a control cycle. The predetermined feature may be regarded as a "trigger event" as it marks the commencement of the fixed or otherwise predetermined time interval.

The counter may be provided as part of a phase locked loop. However the counter may be provided as a part of other suitable closed loop systems, such as clocking circuits and/or delay locked loops.

In one embodiment there is provided a monitoring circuit for monitoring the performance of a phase locked loop having a divider therein. The divider may be an integer divider or it may be a fractional divider. An integer divider has a first counter whereas a fractional divider comprises at least first and second counters. The first and second counters are often referred to as pulse (P) and skip (S) counters or as program (P) and swallow (S) counters, and the monitoring circuit is advantageously arranged to monitor the value of the P counter. The monitoring circuit comprises at least one memory element for capturing a value of the first counter after a predetermined time from a system event in the operation of the phase locked loop, a variability calculator for comparing a value of the first counter with a preceding value of the counter to calculate a variation, and a circuit responsive to the estimate of variation for outputting a status signal.

In a second embodiment there is provided a circuit for monitoring a system where a counter within the system counts a parameter of the system, said counter being periodically reset in the response to a system event and where variation in a value counted by the counter after a predetermined time from the system event is indicative of variability within the system, the circuit comprising memory elements for storing at least one value of the counter, a variability calculating circuit for comparing a value of the counter with a preceding value of the counter to detect variations with the value counted by the counter, and an output circuit responsive to the variability calculating circuit for outputting a signal for indicating a status of the system.

In a further embodiment there is provided a method of monitoring the performance of a phase locked loop (PLL), wherein the phase locked loop includes at least a first counter provided as part of a divider, the method comprising repeatedly obtaining a value of the first counter after a predetermined time from a trigger event, detecting variations in the value of the counter, and based on a analysis of the variations indicating the status of the PLL.

An apparatus as described herein may include a synchronization circuit for synchronizing sampling of the counter with another signal. In an embodiment of a phase locked loop having a pre-scaler (when it may be a single mode pre-scaler, or it may have a plurality of divide modes or ratios), the output from the pre-scaler may be used as a signal for synchronizing the sampling of the counter value. The synchronization circuit may be at a boundary between an analog part of the circuit, for example the PLL, and a digitally implemented monitoring circuit.

BRIEF DESCRIPTION OF THE DRAWINGS

Embodiments will now be described, by way of illustrative and non-limiting examples, with reference to the accompanying drawings, in which.

DESCRIPTION OF SOME EMBODIMENTS

It is known that oscillators can be used to form multiples of a reference frequency by use of a phase locked loop. An example of a phase locked loop architecture is shown in FIG. 1.

Figure 1:
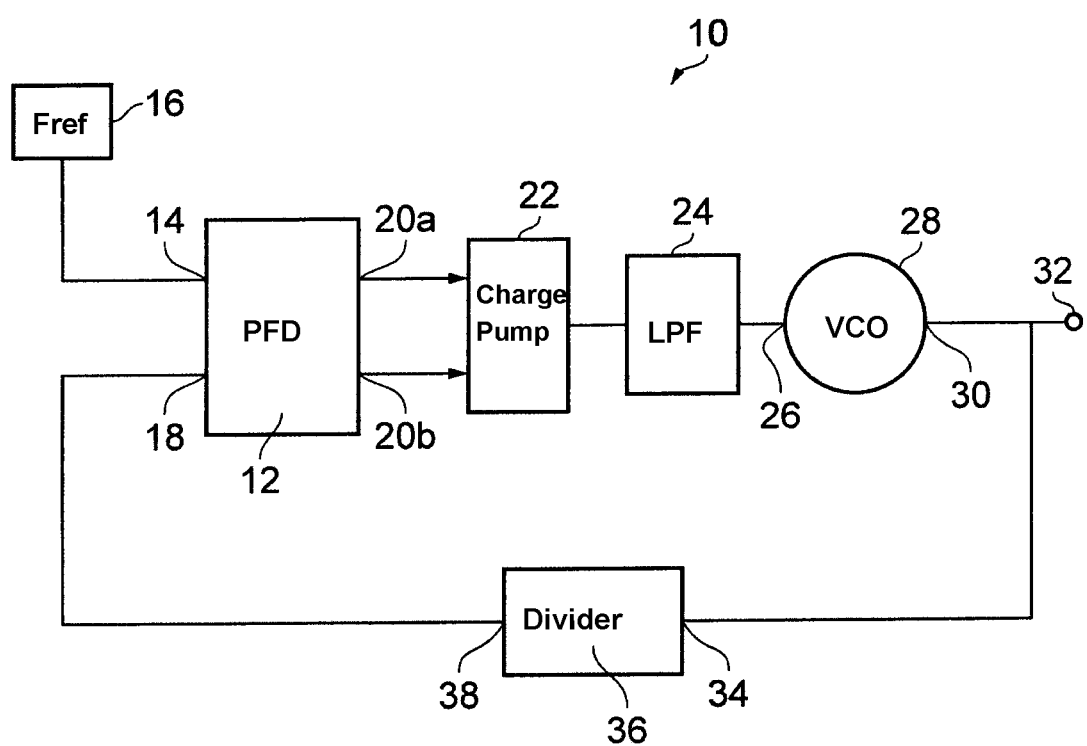
FIG. 1 is a schematic diagram of a prior art phase locked loop.

In the configuration as shown in FIG. 1, a phase locked loop 10 comprises a phase-frequency detector 12 having a first input 14 which receives a reference frequency Fref from a reference clock 16. The phase-frequency detector 12 has a second input 18 which is used to receive a signal for comparison with the reference frequency Fref. An output 20, or as shown here outputs 20a and 20b, of the phase frequency detector 12 are provided to a charge pump 22 to cause the charge pump 22 to either add or remove charge from a capacitor provided as part of a low pass filter 24. An output of the low pass filter 24 is connected to a frequency control input 26 of a voltage controlled oscillator 28 whose output is connected to an output node 32 of the phase locked loop 10 and also to an input 34 of a frequency divider 36. An output 38 of the frequency divider 36 is connected to the second input 18 of the phase frequency detector 12.

In use the divider 36 divides down the output frequency of the voltage controlled oscillator 28, the divided down frequency is compared with the reference frequency by the phase-frequency detector, and the result of the comparison is used to control the charge pump 22 to inject or remove charge as appropriate from a capacitor provided as part of the low pass filter 24. The filtered voltage is then provided to the frequency control input of the voltage controlled oscillator 28.

As a consequence a feedback loop is formed such that $$\frac{F_{out}}{N} = F_{ref}$$

where: Fout is the output frequency of the voltage controlled oscillator 28 and N is the division ratio of the divider.

Such an arrangement provides a fixed frequency output at the output node 32. However this may not be convenient for communications or other systems where a number of closely spaced channel frequencies need to be synthesized with good accuracy. Using programmable integer divide ratios may not yield the desired performance in terms of channel spacing in such systems and may also give rise to issues surrounding divider speed and complexity.

A commonly used PLL topology is a fractional N synthesizer which allows pulses to be removed (also known as "swallowed") so as to synthesize non-integer ratios. Most modern implementations of this technique are based on transitioning or dithering between two divide ratios.

Thus, if the divider has divide ratios of N (where N is an integer) and N+1, and it can be freely switched between these such that the counter divides by N for A oscillator cycles and by N+1 for B oscillator cycles, then the average divide ratio is $$N_{average} = \frac{AN + B(N+1)}{A+B}$$

Such a divider is known as a fractional divider. As frequencies for PLL operations increased, it became known to precede the counter by a prescaler, but the distinction between the counter and prescaler has become less distinct in more modern devices, such that current technology has a dual-modulus prescaler having divide ratios of N and N+1 preceding a counter.

Dividing by N and N+1 on a repetitive and non-changing basis introduces a periodic change in the divide ratio that can manifest itself as a frequency spike in a sideband located either side of the synthesized central frequency. This is undesirable so most implementations of a fractional N synthesizer dither the divide modulus. Sigma-delta techniques can be used to shape the out of band modulation noise.

Figure 2:
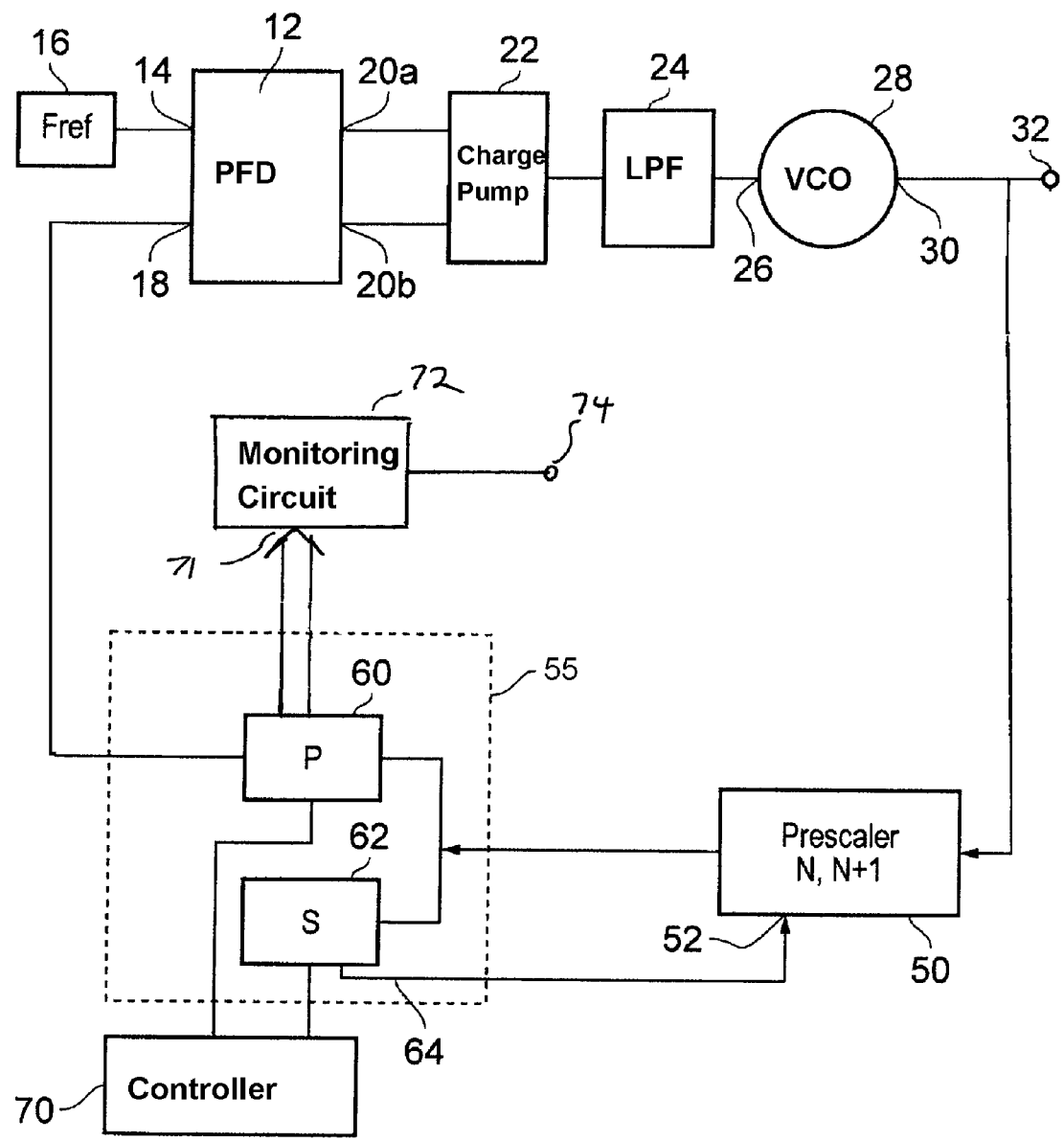
FIG. 2 is a schematic diagram of a schematic diagram of a fractional N divider as part of a phase locked loop showing a connection to a monitoring circuit.

FIG. 2 shows a PLL loop in which parts that have been described with respect to FIG. 1 are identified by the same reference numbers as used in FIG. 1.

An output from the voltage controlled oscillator 28 is provided to a dual modulus prescaler 50 which is operable to divide the oscillator frequency by N or N+1 depending on a control signal received at a divide ratio input 52 of the prescaler 50. The prescaled output from the prescaler 50 is provided to an input of the fractional divider 55.

The fractional divider 55 is has two individual counters 60 and 62 configured to implement pulse swallowing.

By convention the counters in a dual modulus counter, such as the fractional divider 55, are often referred to as an "S" counter and a "P" counter. These stand for "swallow" counter and "program" counter respectively. In other terminologies these are known as A and B counters.

In use, the counters 60 and 62 are set to respective values S and P with P>S. This may occur at the start of each operating cycle. At the start of an operating cycle the prescaler 50 is controlled so as to divide by a first division ratio, which is typically N+1. The S counter 62 has not "counted out" the S counts that is has been instructed to count, and each of the P and S counters 60 and 62, respectively, increment or decrement (depending on how a designer has chosen to implement the counters) after every (N+1) oscillator output cycles of the voltage controlled oscillator 28.

Thus the S counter 62 reaches the end of its count after S(N+1) oscillator cycles.

Once the S counter 62 reaches the end of its count the output 64 provided by the S counter 62 to the prescaler 50 changes value, and then the prescaler 50 switches to a different division ratio, e.g. divide by N.

The P counter 60 counts for (P−S) prescaler output cycles. Thus it counts out a further (P−S)N oscillator output cycles.

Thus, the total number of oscillator cycles counted out in one operation cycle of the dual modulus prescaler 50 is $$M = S(N+1) + (P-S)N$$
$$= PN + S$$

The values of the P and S counters 60 and 62, respectively, can be varied from cycle to cycle by a controller 70 that provides a sigma-delta modulation to provide noise shaping. This technique is known to the person skilled in the art.

It can also be observed that, for a PLL 10 which has achieved frequency lock, then if starting from the beginning of one counter cycle another counter is used to count out pulses from the reference clock 16 or from a further timing system, then after a predetermined number of pulses or time the program counter 60 should always have the same value in it each time this "lock test" is performed if the PLL 10 is locked. This behavior can be exploited to formulate a status indicator of the PLL system, such that:
1. If an output of the program counter 60 varies by less than a threshold over successive lock test counts, then the PLL 10 is frequency locked.
2. If the output of the program counter varies by more than a threshold over successive lock test counts the PLL 10 is not frequency locked.

This observation can be used to provide a status indicator the PLL 10.

As shown, the value of the P counter 60 may be provided to an input 71 of a monitoring circuit 72 which provides a status signal at an output 74 to indicate whether or not the PLL 10 is locked or not locked.

The PLL 10 may move out of the frequency lock for several reasons. One reason is that a frequency change has been instructed by the controller 70 and hence the P and S values may have changed significantly. The closed loop of the PLL 10 has a setting time as determined by the low pass filter 24, in combination with the amount of charge injected by the charge pump 22 and the response characteristic of the VCO 28, and hence the PLL 10 will become unlocked until the control loop settles.

However other reasons may cause the PLL 10 to unlock. Thus, for example, the supply voltage may have dropped outside of an acceptable operating range, noise on the supply may have perturbed the VCO 28, or the temperature that the PLL 10 is being operated as may be inappropriate, thus causing the PLL 10 to behave in unexpected ways.

The behavior of the P counter 60 can be observed in several ways. For example in one embodiment the value of the P counter 60 at the end of a test count or test time may be compared with a preceding value of the P counter 60. The preceding value may be the value as determined by an immediately preceding test count or time, but need not be if more memory to hold counter values is provided. The test count or test time may be run from a clock such that it is less than one cycle of the reference clock or it may exceed one cycle of the reference clock 16.

Figure 3:
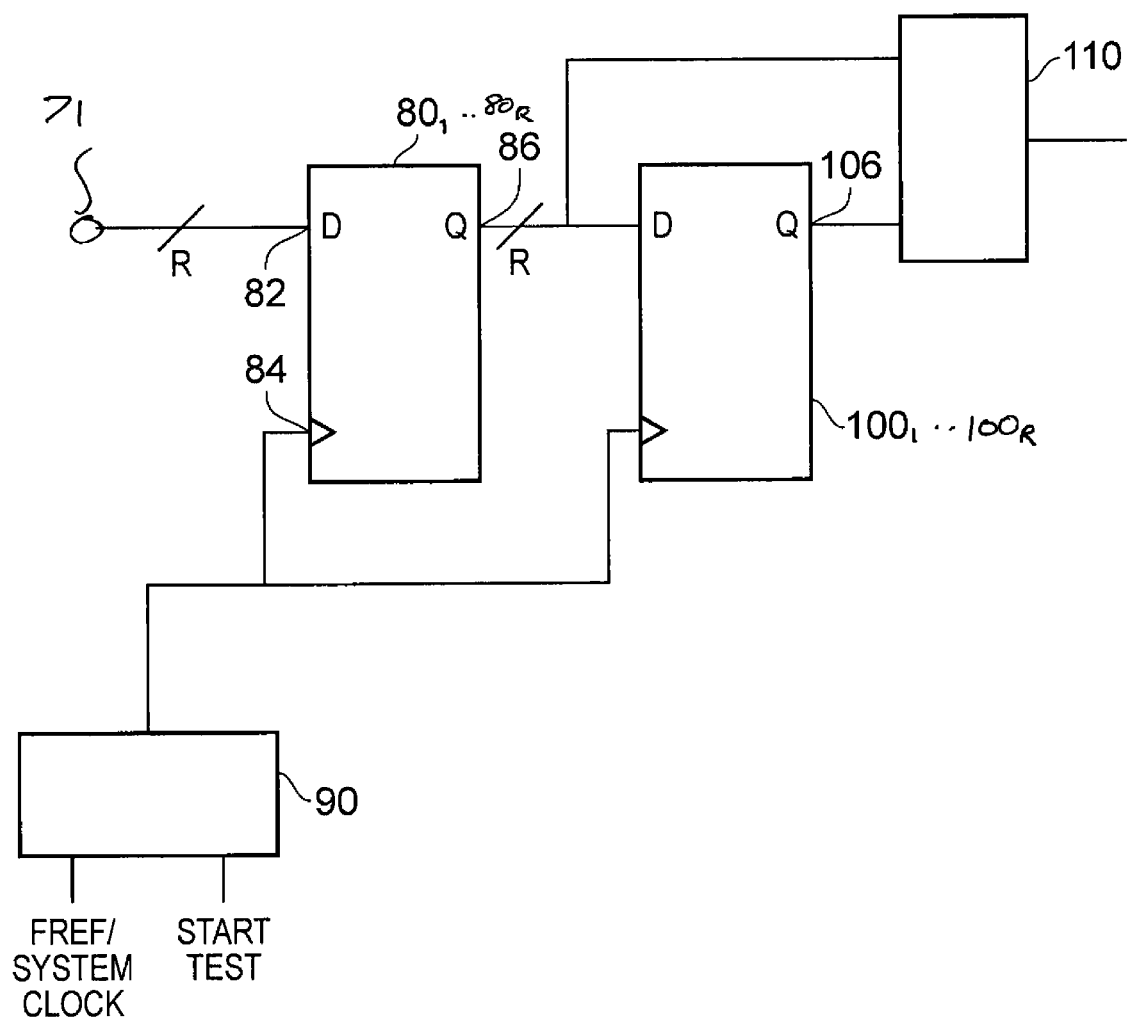
FIG. 3 is a circuit diagram of a first monitoring circuit.

A monitoring circuit for observing the P counter 60 is shown in FIG. 3. The monitoring circuit of FIG. 3 is an example of the monitoring circuit 72 of FIG. 2. The monitoring circuit of FIG. 3 can alternatively be implemented in connection with the PLL 10 of FIG. 1. The monitoring circuit comprises, for each of the R bits of the P counter output word, first latches 80$_1$ to 80$_R$ that receive a respective one of the first to Rth bits from the program counter 60 at a data input 82 and latch the respective bit in response to a latch signal provided to a "clock" input 84 of the first latches 80$_1$ to 80$_R$. The latches act together to form a memory element. The latch signal is provided by a test counter 90 which counts system clock or reference frequency Fref cycles after receiving a start command issued by a controller (not shown). The test counter 90 counts down a period that is programmable, as will be described later with respect to FIG. 5.

The outputs Q of the first latches 80$_1$ to 80$_R$ are passed to second latches 100$_1$ to 100$_R$. Thus the Q output 86 of each first latch is connected to a data input D of the corresponding second latch 100. A respective latch 80$_1$ to 80$_R$ and 100$_1$ to 100$_R$ is provided for each bit of the P counter 60 output word. The outputs of second latches 100$_1$ to 100$_R$ can be compared by a multi-bit comparator 110. Thus, the Q output 86 of the first latches 80$_1$ to 80$_R$ may be provided to a first multi-bit input of the comparator 110 and a Q output 106 of the corresponding second latched 100$_1$ to 110$_R$ may be provided to the second input of the comparator 110. The comparator 110 may be implemented as an XOR gate for each bit such that it asserts a "1" if the bits are different and a "0" if the bits are the same. The outputs of a comparison for each bit in the comparator 110 may be ORed together so as to indicate if one program counter 60 value differs from a preceding one. Thus the monitoring circuit of FIG. 3 functions as a variability calculator that looks for changes in successive values of the P counter. The variability calculator forms an estimate of variation of the P counter value from one cycle to a subsequent cycle.

The arrangement of FIG. 3 is particularly suitable for use when the PLL 10 is operated so as to perform an integer divide, such as the PLL 10 of FIG. 10.

Figure 4:
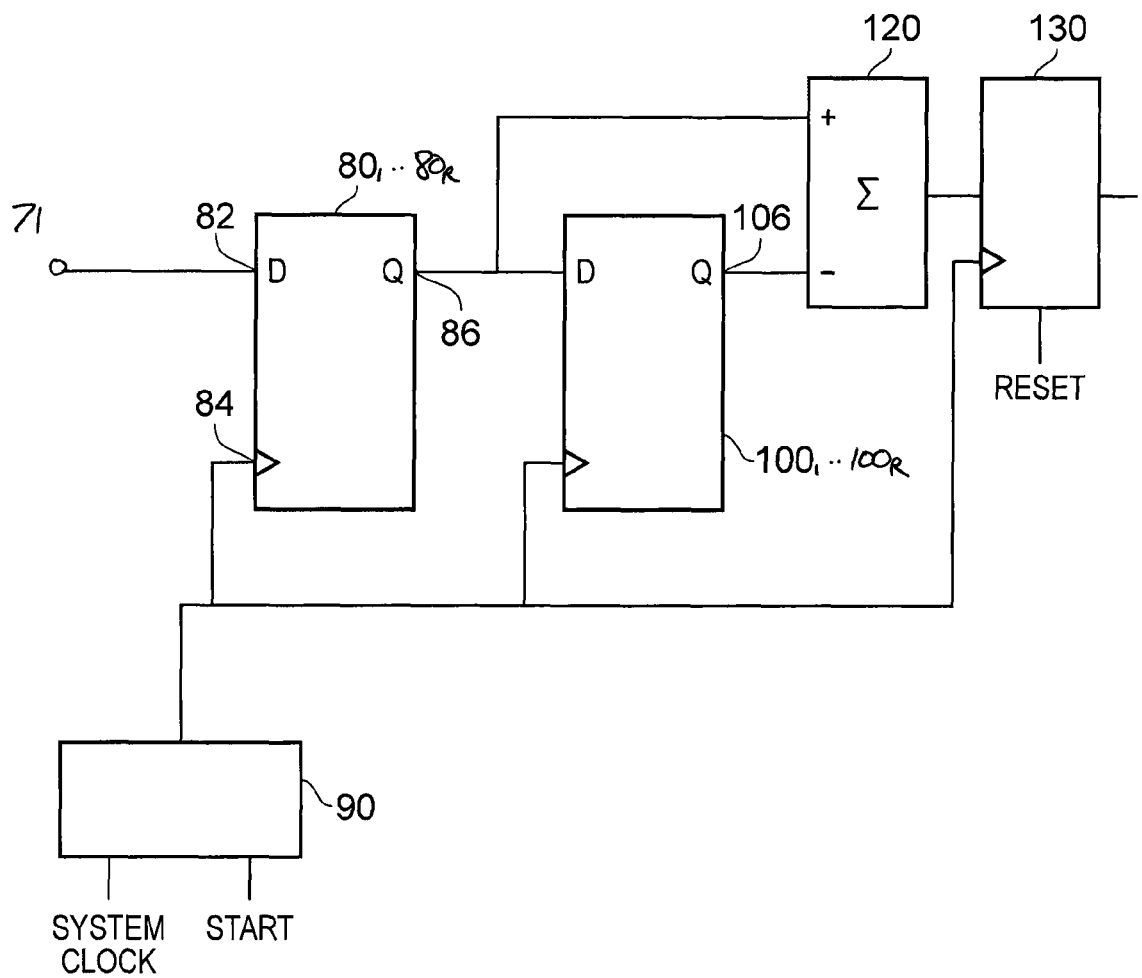
FIG. 4 is a circuit diagram of a second monitoring circuit.

FIG. 4 shows a monitoring circuit which is similar to the monitoring circuit of FIG. 3 and which also functions as a variability calculator, but where the comparator 110 has been replaced by a difference forming circuit, such as a summer 120 having a summing input and a subtracting input. This monitoring circuit can form a difference between one value of the program counter 60 and a succeeding one. The monitoring circuit can be used for examining the program counter 60 over a plurality of the test cycles for a PLL 10 operating in integer divide mode, such as the PLL 10 of FIG. 1, or fractional divide mode, such as the PLL of FIG. 2. The monitoring circuit of FIG. 4 is an example of the monitoring circuit 72 of FIG. 2. The output of the summer 120 may be provided to an integrator 130 arranged to integrate the output of summer 120. In a digital implementation the integrator 130 may be provided as an accumulator circuit that is periodically reset by the test counter 90, and then adds the output value of the summer 120 to a value the accumulator had counted to in a previous update cycle.

The integrator 130 may be formed as a relatively small counter if it is used to integrate over a relatively few lock test cycles or if the designer decides to take steps to stop the counter from counting past "overflow" values.

The output of the comparator 110 of FIG. 3 or the integrator 130 of FIG. 4 may be used to provide a status signal.

However, the observation period may extend past the maximum measurement time if a small counter is used, for example because the measurement time in this approach is less than a settling time for the feedback loop of the PLL 10.

Under such circumstances the monitoring circuit of FIG. 4 can be extended to accumulate the results of a plurality of lock test cycles.

Figure 5:
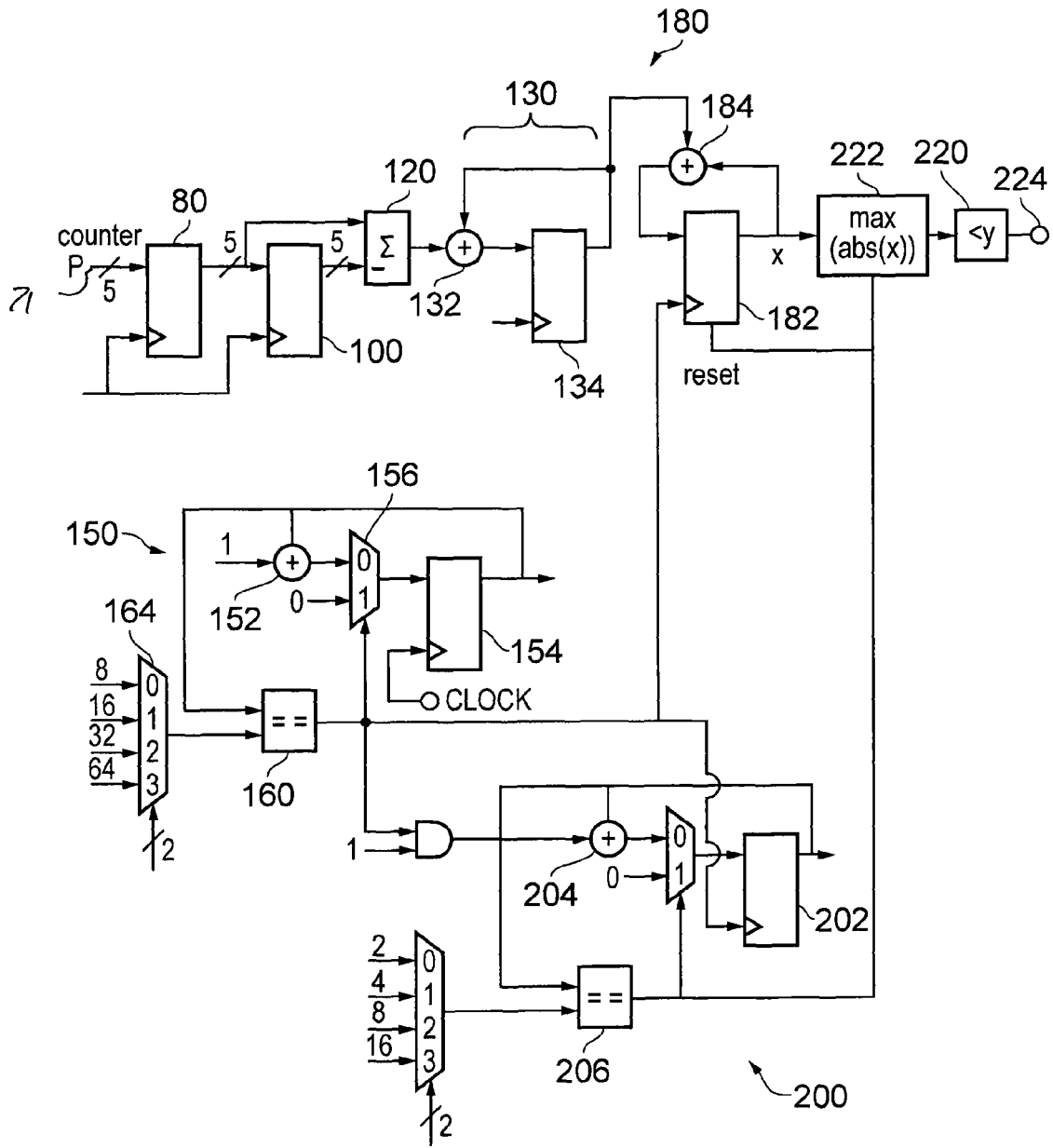
FIG. 5 is a circuit diagram of a third monitoring circuit.

FIG. 5 shows a monitoring circuit which builds on the monitoring circuits described with respect to FIGS. 3 and 4. Thus, as described with respect to FIG. 4 the output of the program counter 60 of the fractional divider 55 is provided to first latches 80 so as to latch the counter value at a predetermined sample time compared to a start of one or more PLL lock cycles. Successive measurements are made, and the latched value from the first latches 80 is passed to second latches 100 and a difference between the current value and a preceding program counter 60 value is generated by the summer 120 (although summer 120 has been referred to as a "summer" because it adds a first value to a negated second value—the circuit may also be referred to as a difference forming circuit or a subtractor). An output of the summer 120, which represents a difference between a current and a preceding P counter 60 measurement is supplied to an integrator 130, which in FIG. 5 is shown as being formed by a further summer 132 and a latch 134, such that the summer 132 can form the sum of the current output value of the latch 134 and sum it with the output of the summer 120, and the resulting sum can be held by the latch 134. The output of the integrator 130 represents the integral of the difference between successive measurement cycles over a programmable accumulation window of J clock cycles, such that the accumulation window has a duration $T_1 = J \times T$, where T is a clock period of a reference clock. The length of the accumulation window is determined by a counter and compare circuit 150. The counter and compare circuit 150 comprises a summer 152 which is arranged to receive an output of a multi-bit latch 154 at one input of the summer, and a value representing unity at a further input of the summer 152. Thus the summer 152 gets to form a value which represents an increment of the value held in the latch 154. This incremented value is supplied to the latch 154 by way of a multiplexer 156. The multiplexer 156 can be controlled to either pass the output of the summer 152 to the latch 154, thereby causing the counter and compare circuit 150 to count, or a zero to the latch 154, thereby resetting the count and compare circuit 150. The digital value held in the latch 154 is also provided to a comparator 160 which compares the current counter value with a input word representing a length of the accumulation cycle. The input word can be provided via a multiplexer 164 such that a two bit control word can select between any one of four predetermined accumulation window lengths.

In a test circuit the accumulation window lengths were substantially binary weighted. A first accumulation window length was approximately 155 nano-seconds. The next accumulation window length was approximately 308 nano-seconds. A third accumulation window length was approximately 616 nano-seconds, and a fourth accumulation window length was approximately 1230 nano-seconds. These times are given by way of example only, and a system designer is free to choose any times that they deem desirable, any number of predetermined times that they think appropriate, or the accumulation window time may be freely determinable by loading a accumulation window length value into a register that is connected to one of the inputs of the comparator 160. The counter is expected to update J times during the accumulation window. At the end of each accumulation window, the comparator 160 asserts a signal which causes the accumulated value to be passed to a following stage. This can, as shown in FIG. 5, be performed by clocking a subsequent integrator 180. The subsequent integrator 180 comprises a summer 184 within a feedback loop associated with a latch 182. Thus its operation is substantially the same as the integrator 130.

The integrator 180 integrates over a number of observation windows, i.e. K windows, as counted up by a counter circuit 200 comprising a latch 202 and a summer 204 operating in a manner similar to that described with respect to the counter and compare circuit 150. Thus the lock test is performed over a time period $T_2=J \times K \times T$. The output of the latch 202 is supplied to a comparator 206 which receives a predetermined number representing the number of accumulation windows which are to be observed over. Thus the counter 200 may seek to observe 2, 4, 8 or 16 accumulation windows amounting to 2.47, 4.92, 9.84 and 19.68 microseconds worth of data before passing the output of the summer 182 to a comparator 220 by way of a modulus forming circuit 222, other accumulation periods are, of course, possible. At the end of the observation window time the latch 182 is reset by an appropriate mechanism, such as a reset pin, or providing additional circuitry to load it to a reset value. The comparator 220 compares the accumulated difference between successive program counter 60 values, and compares this with the threshold. In the example shown in FIG. 5 the threshold is y, and in this example y=1, but other values may be used and may be programmable. The result of the comparison is passed to an output 224 which in this example outputs a digital "1" to show that the PLL 10 is locked and healthy, or outputs a "0" to show that the PLL is unlocked. This signal is a status signal. Thus the same circuit can give an explicit indication of the PLL 10 being locked or the PLL 10 being unlocked. The monitoring circuit of FIG. 5 is an example of the monitoring circuit 72 of FIG. 2 and the output 224 of FIG. 5 can correspond to the output 74 of FIG. 2.

FIGS. 6a to 6f are timing diagrams showing the operation of the circuit shown in FIG. 5 in greater detail.

Figures 6A, 6B, 6C, 6D, 6E, 6F:
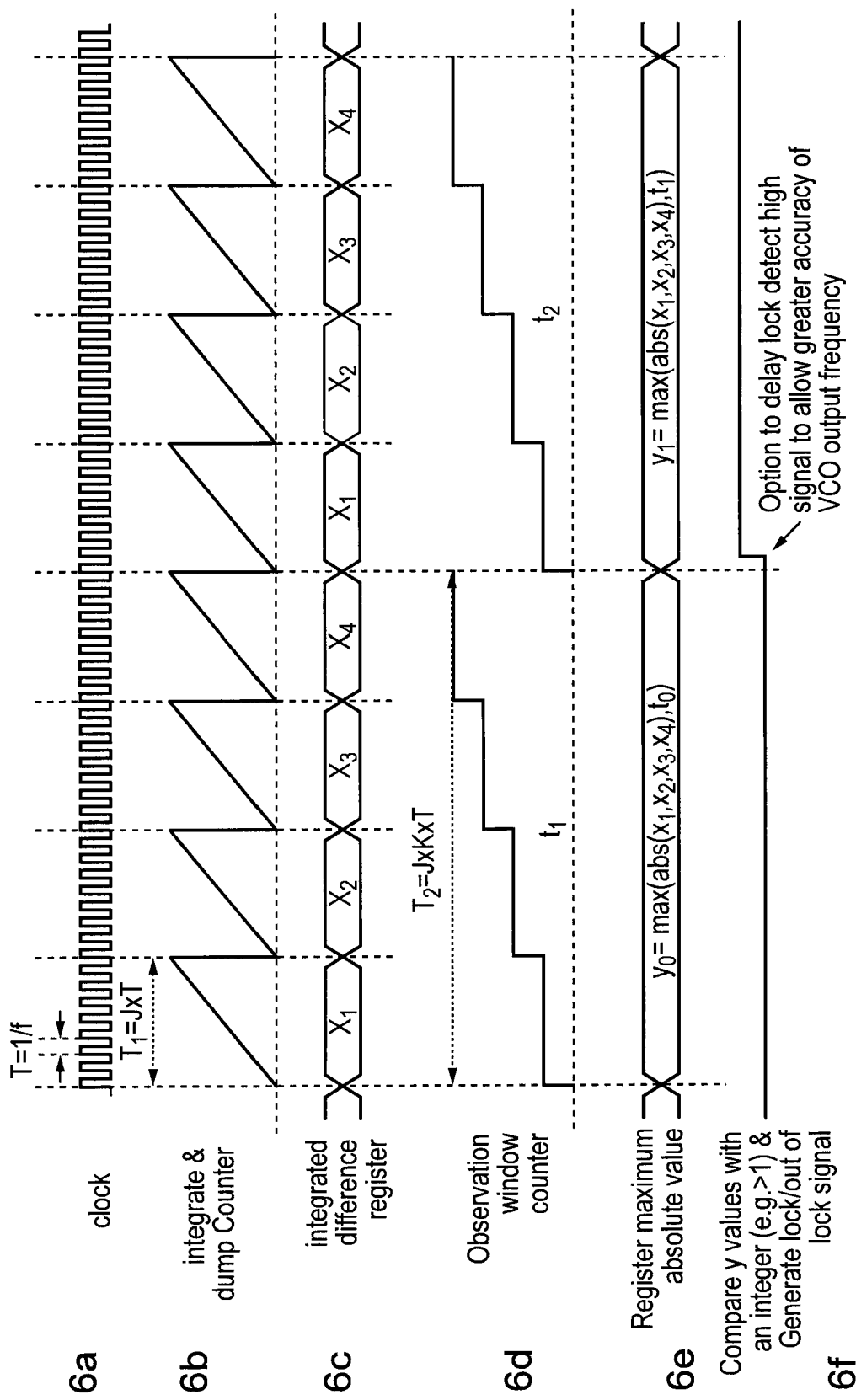
FIGS. 6a to 6f are timing diagrams showing the evolution of various signals within the circuit of FIG. 5.

FIG. 6a shows clock signals used for timing control of the monitoring circuit of FIG. 5. In one example of the monitoring circuit, the clock had a frequency of around 52 MHz such that counting 8 clocks would give a timing window of around 155 nanoseconds, 16 clock cycles would give 208 nanoseconds and so on. Thus the value of counter of the counter and compare circuit 150 increments as schematically shown in FIG. 6b until such time as it reaches the value supplied to the comparator 160. When the output of the comparator 160 becomes asserted it causes the multiplexer 156 to select "0" as the next input for the latch 154 such that the counter in the counter and compare circuit 150 becomes reset, as shown in FIG. 6b. Thus a period $T_1=J \times T$ can be counted out.

At the end of each time period as counted out by the counter of the counter and compare circuit 150, the integrated value of the P counter 60 from one sampling instant of the counter value to the next, and as accumulated by latch 134 and summer 132, is clocked into latch 182, as represented by FIG. 6c.

FIG. 6d shows the value of the observation window counter 200 as it counts the number of times the counter and compare circuit 150 has completed an accumulate and dump cycle, and thereby counts an observation window time $T_2=J \times K \times T$.

FIG. 6e shows the value in modulus forming circuit 222, and FIG. 6F shows the output of the circuit.

FIGS. 6a to 6f correspond to a PLL being unlocked to start with, and then becoming locked so the output of the comparator 220 transitions from "0" to "1". The assertion of the status signal, which in this example is a lock detected signal may be delayed, if desired, by using a strobed comparator 220 and delaying assertion of the clock to the strobed comparator 220 by a counter/timer circuit (not shown).

Other circuits for flexibility counting a number of clock pulses before examining the number of differences in the P counter values from one cycle to a next may also be used.

Figure 7:
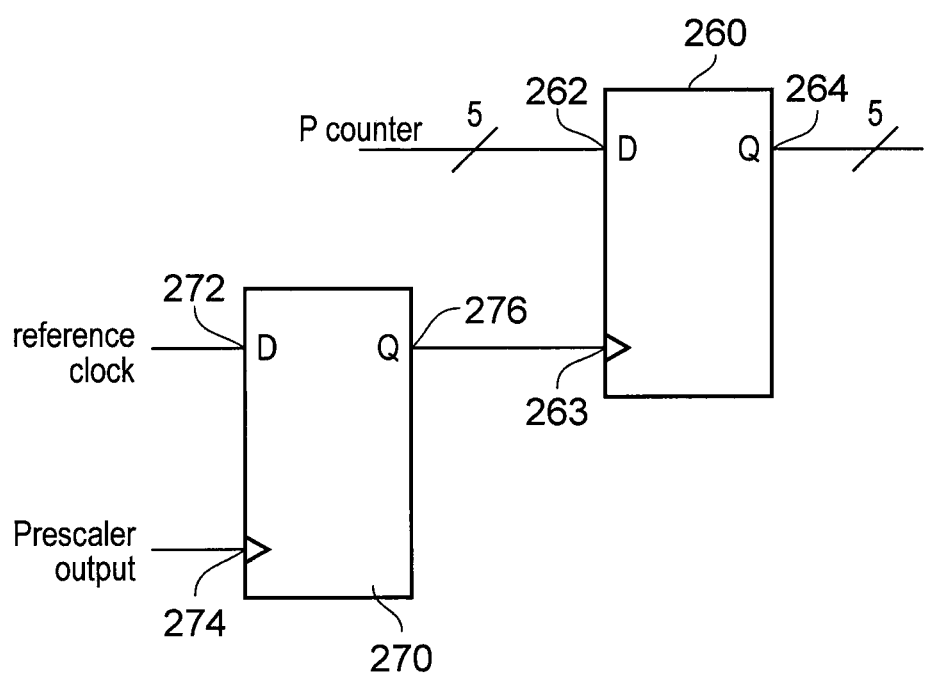
FIG. 7 shows a synchronization circuit that can be used to time shift the rising and falling edges of a system clock.

It may be desired to synchronize capturing the P counter value with that of the pre-scaler output. A synchronization circuit for achieving this is shown in FIG. 7. The synchronization circuit comprises a multibit register 260 which in this example is implemented as a D-type register. The multibit output of the P counter 60 is provided to the multibit data input of the register 260. The data at the data input 262 is latched by the register 260 upon receipt of a rising edge at a clock input 263, and is presented to the multibit "Q" output 264.

The rising edge for the clock input 263 can be provided by the reference clock directly. Alternatively the transition between high and low states of the reference clock can be synchronized with transitions, such as rising edges, of the pre-scaler output by use of a further latch 270 as shown in FIG. 7. The latch 270 is a D type latch. The reference clock is supplied to a D (data) input 272 of the latch, and the output of the pre-scaler 50 (FIG. 2) is provided as an input to the clock input 274. The Q output 276 of the latch 270 is provided to the clock input of the latch 263. The pre-scaler output is at a higher frequency than the reference clock (by a factor of P), and thus the action of the register 270 is to present a synchronized signal at its output 276 that has the frequency of the reference clock 16 (FIG. 2) but where the rising and falling edges of the synchronized signal are in temporal alignment with the rising edges of the pre-scaler output.

This approach enables timing to be achieved at the output frequency of the pre-scaler 50, whilst still allowing the lock checking circuitry to work at the much lower frequency associated with the system clock.

Use of the pre-scaler output to adjust the timing of the synchronized signal, edges means that whilst the system is settling the pre-scaler output is also settling. This means that in an unsettled state the counting period over which the lock condition is evaluated also changes slightly and this can enhance the sensitivity of the system to detecting the unlocked condition of a PLL.

The circuits described herein allow two integrator circuits 130 and 180 to act in unison with two counter circuits (counter and compare circuits 150 and 200) to allow the PLL performance to be monitored over a wide range of times. This flexibility by programming of the two counter circuits allows the monitoring time to be varied depending on the PLL mode of operation. Thus, when the PLL is supposed to be operating at a nominally constant frequency the observation window and/or accumulation windows may be set to reduced values, such that the PLL lock indication signal is updated regularly. However, when a frequency change is requested the parameters of the PLL may be known to be such that it will take a minimum amount of time to re-establish a lock. Under such circumstances, the accumulation window and observation window times may be extended if desired to reduce the risk of giving a false "locked" signal whilst the PLL is settling. It would be expected that longer accumulation times give greater accuracy, and hence less risk of a false "locked" indication. It is thus possible to provide a compact digital circuit which can be implemented at low cost for monitoring PLL performance by observing the change over time of the program counter within a fractional end divider circuit. It should be noted that the circuit described herein is not restricted to only examining the program counter and the performance of other counters within feedback circuits may be monitored to determine the variation of those counters at regular points in time from a given point within an operating cycle of the feedback circuit. The frequency synthesizer based on a PLL is suitable for use within may circuits, a typical example being use within a radio or a mobile telephone.

Although the described embodiments have related to checking the value of the P counter, the value of either or both counters could be monitored and used to generate a status signal. Further, the circuit can be adapted to work with many PLL architectures, including those with integer dividers. Such PLL circuits are often found in communication devices, such as radio/wireless receivers and radio/wireless transmitters and mobile telephones.

What is claimed is:

1. A monitoring circuit electrically connectable to a phase locked loop (PLL) and configured to monitor performance of the PLL, the monitoring circuit comprising:
   at least one memory element configured to capture a value of a first counter of a divider of the PLL after a predetermined time from a system event in the operation of the PLL; and
   a variability calculator configured to compare a value of the first counter with a preceding value of the first counter to calculate a first value representative of a difference in values of the first counter, wherein the variability calculator is further configured to sum the first value from a plurality of observations of the operation of the PLL to generate a sum, wherein the monitoring circuit is configured to compare the sum with a threshold value and to output a status signal indicating a locked status of the PLL.

2. The monitoring circuit of claim 1, wherein the divider of the PLL is a fractional divider comprising the first counter and a second counter.

3. The monitoring circuit of claim 1, wherein the system event corresponds to at least one of setting the first counter to an initial value at the commencement of a cycle of the PLL or receipt of a clock signal.

4. The monitoring circuit of claim 1, wherein the at least one memory element comprises at least one latch configured to latch an output of the first counter.

5. The monitoring circuit of claim 1, wherein the at least one memory element comprises two series connected latches, and wherein the variability calculator comprises a subtractor configured to calculate the first value, and wherein the first value is representative of a difference in values held by the two series connected latches.

6. The monitoring circuit of claim 1, further comprising at least one counter or timer configured to determine at least one of a number of operating cycles of the PLL that the PLL is monitored for or a duration that the PLL is monitored for.

7. A communication device including the monitoring circuit of claim 1.

8. The monitoring circuit of claim 1, in which transitions of a system clock are synchronized with transitions of the divider or a prescaler within the PLL.

9. The monitoring circuit of claim 1, wherein the variability calculator is configured to compute a sum of variations over at least one of a first number of clock pulses or over a first time period.

10. The monitoring circuit of claim 9, in which the monitoring circuit is configured to monitor the output of the variability calculator over an observation window, and a maximum modulus output of the variability calculator is compared with the threshold value.

11. The monitoring circuit of claim 10, wherein the monitoring circuit is configured to adjust a length of the observation window.

12. The monitoring circuit of claim 9, wherein the monitoring circuit is configured to adjust at least one of the first number of clock pulses or the first time period.

13. An electronic system comprising the monitoring circuit of claim 1 and the PLL, wherein the monitoring circuit is electrically connected to the PLL.

14. A circuit electrically connectable to a system wherein a counter within the system counts a parameter of the system, said counter being periodically reset in response to a system event and wherein variation in a value counted by the counter after a predetermined time from the system event is indicative of variability within the system, the circuit comprising:
   one or more memory elements configured to store at least one value of the counter;
   a variability calculating circuit configured to:
      compare a value of the counter with a preceding value of the counter to generate a comparison result;
      accumulate the comparison result for a first number of times to generate a first accumulated result; and
      accumulate the first accumulated result for a second number of times to generate a second accumulated result; and
   an output circuit configured to output a status signal indicating a lock status of the system in response to the second accumulated result.

15. An electronically-implemented method of monitoring performance of a phase locked loop (PLL), the method comprising:
   repeatedly obtaining a value of a first counter of the PLL after a predetermined time from a trigger event, wherein the first counter is part of a fractional divider;
   comparing consecutive counter values for a first number of times;
   processing the first number of comparisons to obtain a measure of variability; and outputting a lock detect signal indicative of a locked status of the PLL based on said processing, wherein the method is performed by electronic circuitry.

16. The electronically-implemented method of claim 15, in which said processing comprises summing the first number of comparisons a second number of times, and comparing a result of said summing with a range of values to determine a state of the lock detect signal.

17. The electronically-implemented method of claim 16, wherein the second number is configurable.

18. The electronically-implemented method of claim 15, wherein the first number is configurable.

19. An apparatus comprising:
a phase-locked loop comprising a prescaler and a fractional divider, the fractional divider comprising a first counter electrically coupled to the prescaler; and
a synchronization circuit configured to generate a synchronized counter signal based at least in part on an output of the prescaler and an output of the first counter, wherein the synchronized counter signal corresponds to the output of the first counter, and wherein transitions of the synchronized counter signal are synchronized with transitions of the output of the prescaler.

20. The apparatus of claim 19, wherein a frequency of the prescaler output is higher than a frequency of the first counter output.

* * * * *